United States Patent [19]
Hibbs et al.

[11] Patent Number: 5,508,803
[45] Date of Patent: Apr. 16, 1996

[54] METHOD AND APPARATUS FOR MONITORING LITHOGRAPHIC EXPOSURE

[75] Inventors: Michael S. Hibbs, Westford; William C. Joyce, Essex Junction, both of Vt.

[73] Assignee: International Business Machines Corporation, Armonk, N.Y.

[21] Appl. No.: 359,686

[22] Filed: Dec. 20, 1994

[51] Int. Cl.⁶ .................................................. G01J 1/02
[52] U.S. Cl. ............................................................ 356/243
[58] Field of Search .......................... 356/243, 399–401; 250/548

[56] References Cited

U.S. PATENT DOCUMENTS

| | | | |
|---|---|---|---|
| 4,183,990 | 1/1980 | Uchida et al. | 356/243 |
| 4,575,124 | 3/1986 | Morrison | 356/243 |
| 4,588,298 | 5/1986 | Nakamura | 356/243 |
| 4,788,433 | 11/1988 | Wright | 250/474.1 |
| 4,902,899 | 2/1990 | Lin et al. | 250/492.1 |
| 5,124,927 | 6/1992 | Hopewell et al. | 356/401 |
| 5,213,916 | 5/1993 | Cronin et al. | 430/5 |
| 5,276,337 | 1/1994 | Starikov | 356/401 |
| 5,300,786 | 4/1994 | Brunner et al. | 356/401 |

*Primary Examiner*—Hoa Q. Pham
*Attorney, Agent, or Firm*—Wayne F. Reinke; Heslin & Rothenberg

[57] ABSTRACT

A lithographic mask with an exposure monitor for imaging a gray scale feature. The exposure monitor has abutting regions of differing optical density disposed on the mask for imaging the gray scale feature by taking advantage of diffraction effects. After calibrating gray scale feature size to critical feature size, a gray scale feature may be imaged to monitor critical feature size due to exposure.

11 Claims, 14 Drawing Sheets

METHOD AND APPARATUS FOR MONITORING LITHOGRAPHIC EXPOSURE

BACKGROUND OF THE INVENTION

1. Technical Field

The present invention generally relates to photolithographic projection of a pattern onto a substrate coated with a light-sensitive material. More particularly, the present invention relates to a mask pattern resulting in an imaged feature that can be measured to monitor exposure.

2. Background Art

As photolithography has progressed, feature size or linewidth has been reduced to a point where precise measurement instrumentation, such as a scanning electron microscope, is needed to measure same. However, such measurement instrumentation is expensive and slows down the production process, for example, in semiconductor fabrication. In addition, when the measurement indicates a feature size outside the acceptable range from the design, one cannot be completely sure whether it is due to exposure or focus, since both affect the size of the printed image. Thus, it would be helpful if there was a way to isolate the effects of exposure from focus on feature size.

In the past, partially transmitting regions of a lithographic mask have been used to achieve a range of exposures from a single mask for resist sensitivity characterization studies. For example, masks have been made with large, spaced partially transmitting windows, several millimeters in size, to provide a discrete range of exposure levels. The exposure was then calibrated according to when a particular patch was developed relative to the others. However, the size and spacing of the partially transmitting windows preclude their use on production wafers and may not provide an optimum exposure setting for the particular feature size desired.

In addition to the partially transmitting windows, at least one attempt has been made to achieve a gray scale mask structure for monitoring exposure. A mask was created with a range of line sizes from the center of the structure to the edge on either side thereof, keeping a constant pitch. When the structure is imaged, the small lines on the mask, smaller than the ability of the lithographic optics to resolve, cause the lines to appear to blur together to create a gray scale feature in the resist on the semiconductor wafer. This process can be analogized to newspaper recreations of photographs, where black and white dots are spaced such that the resolution of the human eye from a reading distance interprets them as shades of gray. However, the effectiveness of this method is reduced as the resolution of the lithographic tool is improved. In addition, the small lines strain the ability of the mask making equipment, and the equipment that verifies the mask pattern may not be able to discern such small lines.

Thus, a need exists for a way to monitor exposure effects on feature size without intervening focus effects and without depending on slow and expensive measurement tools.

SUMMARY OF THE INVENTION

Briefly, the present invention satisfies the need for an exposure monitor that is focus insensitive and reduces dependence on slow and expensive measurement tools by providing a mask structure for creating a linear light intensity distribution after imaging through a projection lens, which creates a gray scale feature, the size of which is indicative of critical feature size due to exposure. A gray scale feature is a measurable feature created in light-sensitive material by a projected distribution of light with the light intensity varying linearly across some range of values.

In accordance with the above, it is an object of the present invention to provide a way to monitor exposure in a lithographic system.

It is another object of the present invention to provide an exposure monitor that exhibits insensitivity to focus variations.

It is still another object of the present invention to provide an exposure monitor for imaging a gray scale feature.

It is yet another object of the present invention to provide an exposure monitor for imaging a gray scale feature indicative of the size of critical features imaged in the same lithographic system.

A further object of the present invention is to provide an exposure monitor for monitoring feature size due to exposure to reduce dependence on slow and expensive measurement tools, in favor of faster and less expensive optical measurement tools.

The present invention provides, in a first aspect, an exposure monitor for imaging a gray scale feature. The exposure monitor comprises a plurality of abutting regions, each of the plurality of abutting regions having an optical density different from that of each other of the abutting regions immediately adjacent thereto. The exposure monitor may comprise a substrate, and a plurality of patches of different sizes and optical transmissivities layered on the substrate to create the plurality of abutting regions. In addition, the plurality of abutting regions may comprise a first patch of film on the substrate having a first optical density, and a second patch of film on the substrate abutting the first patch and having a second optical density different than the first optical density. The exposure monitor may be part of a lithographic mask used to image a gray scale feature on a semiconductor wafer for monitoring exposure. The wafer may also contain an imaged critical feature, with the size of the imaged gray scale feature being indicative of imaged critical feature size due to exposure.

The present invention provides, in a second aspect, a method for monitoring exposure in a lithographic system. The method comprises steps of calibrating exposure in the lithographic system such that size of an imaged gray scale feature is indicative of size of an imaged critical feature, imaging a critical feature and a gray scale feature in a layer of light-sensitive material coated on a substrate and measuring the imaged gray scale feature. The gray scale feature is imaged with an exposure monitor of the first aspect. The step of calibrating may comprise imaging a critical feature at a plurality of exposure levels in a layer of light-sensitive material coated on a substrate, imaging a gray scale feature at the plurality of exposure levels in the layer of light-sensitive material with an exposure monitor of the first aspect, measuring each imaged gray scale feature and correlating gray scale feature size to exposure level to obtain gray scale exposure data, measuring each imaged critical feature and correlating critical feature size to exposure level to obtain critical feature exposure data and cross-correlating the gray scale exposure data and the critical feature exposure data. In addition, the step of measuring may comprise optically measuring.

These, and other objects, features and advantages of this invention will become apparent from the following detailed description of the various aspects of the invention taken in conjunction with the accompanying drawings.

BEST MODE FOR CARRYING OUT THE INVENTION

Figure 1:
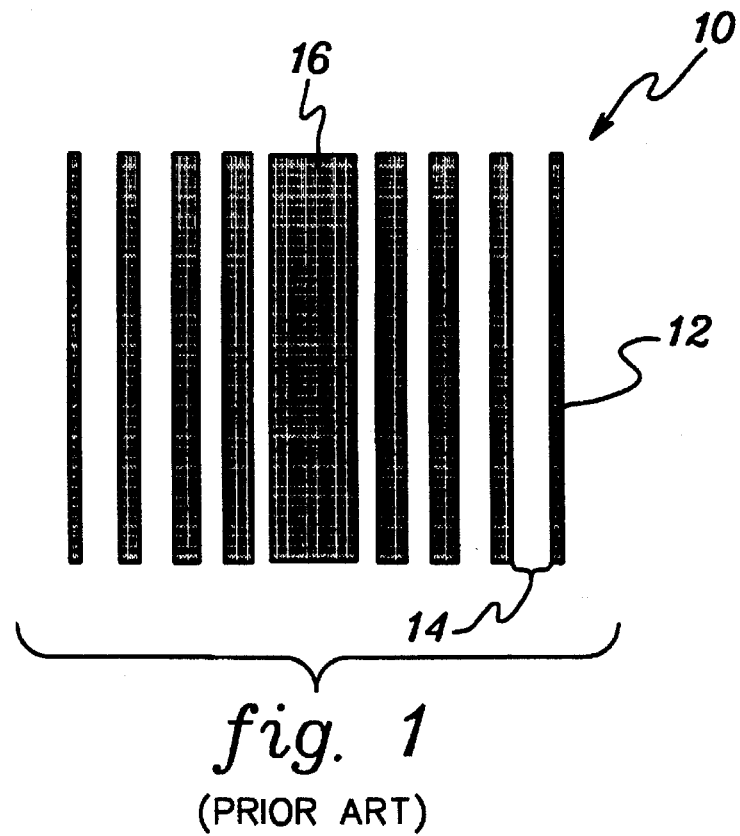
FIG. 1 depicts a prior art mask structure for monitoring exposure in a lithographic system.

FIG. 1 depicts an exposure monitor mask structure 10 disclosed in Starikov, "Exposure Monitor For Microlithography," IBM Technical Disclosure Bulletin N8B 01–90 pages 170–173. Exposure monitor 10 is a nine region design, each region having a width of 0.4 microns, except the center region which has a width of 0.8 microns. All the regions on either side of the center have a pitch of 0.4 microns. As one skilled in the art will know, pitch is the sum of a line and its adjacent space. For example, line 12 is 0.8 microns and adjacent space 14 is 0.32 microns. Center region 16 can be considered to be 2 lines of 0.4 microns or a single line of 0.8 microns. The pitch is chosen in the Starikov exposure monitor to be below the resolution of a lithographic exposure tool used therewith, so the lines appear to blur upon imaging. The line-to-space ratio varies across exposure monitor 10, so that the net effect is that of a single, broad, diffuse line with linearly varying optical intensity on each side of the center 16. The Starikov exposure monitor has a high sensitivity to exposure and process variations, and a certain level of insensitivity to focus variations for the broader lines, such as center line 16. Although the size of the exposure monitor mask structure 10 is large, relative to critical features on the same mask, the exposure monitor includes lines, such as line 12, that are far below the size of common critical features. This causes difficult problems in both mask fabrication and inspection. As the resolution of the exposure tool improves, the line size needed within exposure monitor 10 becomes smaller, straining the ability of the mask fabrication tool to faithfully create the exposure monitor and the ability of the pattern verifier to verify the lines in the exposure monitor.

Figure 2:
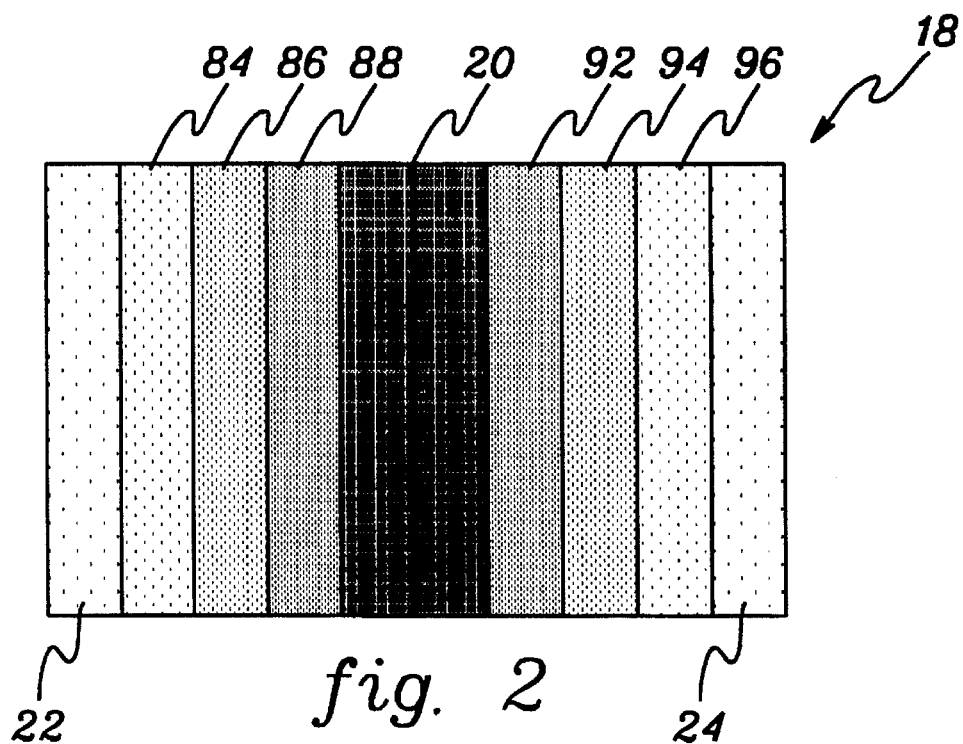
FIG. 2 depicts a preferred exposure monitor according to the present invention.

FIG. 2 depicts a preferred exposure monitor 18 according to the present invention. Exposure monitor 18 includes a range of transparencies from opaque in the center region 20 to nearly transparent in the end regions 22 and 24. Exposure monitor 18 comprises regions 22, 84, 86, 88, 20, 92, 94, 96 and 24 of varying optical density, which transmit varying amounts of an exposure light. Preferably, regions 22 and 24 have an optical density allowing approximately 80% of an exposure light therethrough, i.e., an optical density of about 0.097. Regions 84 and 96 preferably transmit about 60% of an exposure light, corresponding to an optical density of about 0.222. Regions 86 and 94 preferably transmit about 40% of the exposure light, corresponding to an optical density of about 0.398. Regions 88 and 92 preferably transmit about 20% of the exposure light, corresponding to an optical density of about 0.699. Finally, center region 20 preferably transmits none of the exposure light, corresponding to an optical density of greater than 2.199. Exposure monitor 18 may be created on a mask, for example, using the focused ion beam mask repair tool 50 of FIG. 5. A detailed description of mask repair tool 50 will be provided subsequently. The mask repair tool 50 would be used to deposit carbon in the different regions of exposure monitor 18 to achieve the desired light transmission therethrough. Note that there should be a minimal optical phase shift between adjacent regions. This requirement will be met if the thickness of the light-absorbing medium (i.e., carbon film or other light-transmission reducing medium) is small relative to the wavelength of light used to expose the mask.

Figure 3:
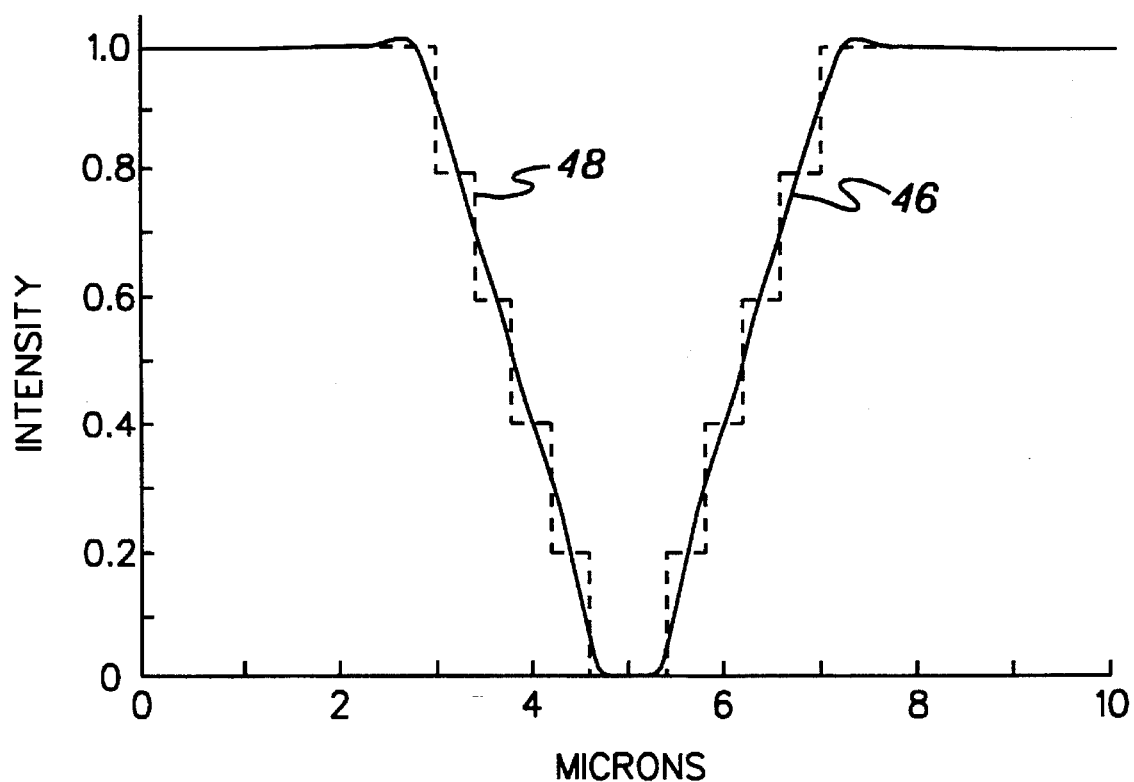
FIG. 3 depicts an aerial image of a gray scale feature imaged with the exposure monitor of FIG. 2.

FIG. 3 is a computer-generated aerial image 46 of a gray scale feature imaged by the exposure monitor 18 of FIG. 2. Unless otherwise noted, all of the aerial images presented herein are computer generated. The exposure monitor of FIG. 2 was created for use with, for example, a lithographic system having an illumination source of 365 nanometers, a numerical aperture of 0.45 and a sigma value of 0.5. The exact dimensions of exposure monitor 18 will depend on the wavelength and numerical aperture of the particular lithographic system. The aerial image 46 is a plot of incident light intensity versus distance from the edge of the imaged gray scale feature in microns. Light transmission plot 48 is superimposed on aerial image 46, and shows the light transmission (absent diffraction effects) through exposure monitor 18, decreasing step-wise from the edge to the center of the structure.

Figure 4:
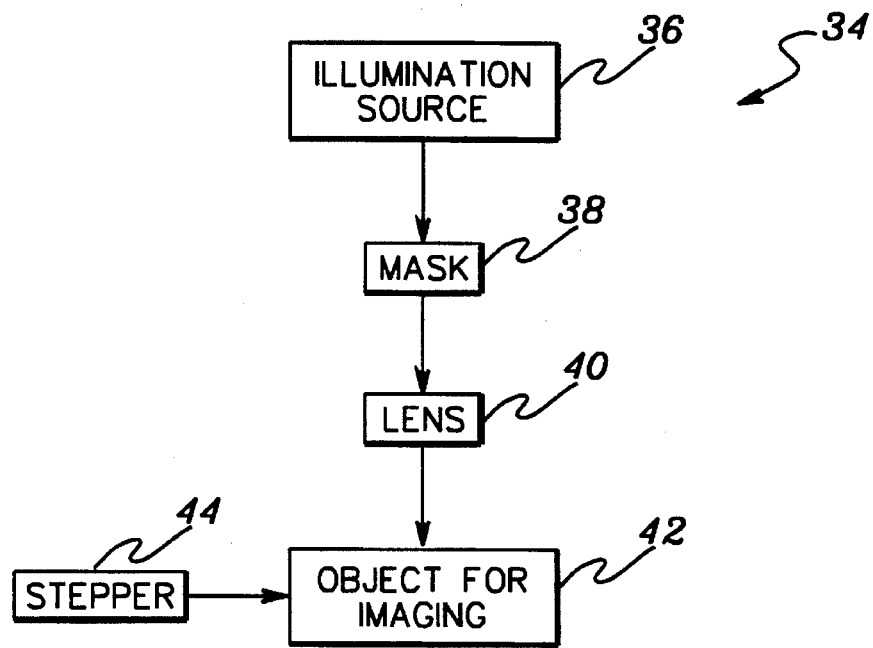
FIG. 4 depicts an exemplary lithographic imaging system including a mask having an exposure monitor of the present invention.

FIG. 4 is a block diagram of an exemplary imaging system 34 useful in imaging a gray scale feature according to the present invention. Projection imaging system 34 comprises an illumination source 36, mask 38, lens 40, an object for imaging 42 and an accurate X, Y, Z location controller or stepper 44. Illumination source 36 may comprise, for example, a mirror, a lamp, a light filter and a condenser lens system. Illumination source 36 outputs "light" to mask 38, having a pattern thereon for replication and an exposure monitor according to the present invention. Mask 38 may include, for example, a pattern for projecting a wiring level of an integrated circuit under fabrication. The pattern of mask 38 may include various imaging structures, for example, clear areas, opaque areas or even phase shifting areas.

As one skilled in the art will know, a physical "binary" mask is one where the mask is clear in some areas and opaque in other areas. The combination of clear areas and opaque areas in conjunction with incident light, image the mask design in a light-sensitive material on the object for imaging 42. A mask may include a phase shifting region. Phase shifting is where there is included, in or on the mask, i.e., in a different plane than the rest of the mask, a means for altering the phase of light passing therethrough. This creates a phase difference that is useful for imaging smaller features. A further discussion of phase shifting can be found in U.S. Pat. No. 5,300,786 issued to Brunner et al. and assigned to IBM.

As used herein, the term "light" refers to light used in photolithography. The terms "light" and "photolithography" in the specification need not be restricted to visible light, but may also embrace other forms of radiation and lithography. For example, energy supplied by lasers, photons, ion beams, electron beams or x-rays are all included within the term "light". Accordingly, the term "mask" is primarily intended to refer to a physical structure, but may also refer to a digitized image used in, for example, electron beam and ion beam lithography systems. Light passing through mask 38 intersects a lens 40, which may be, for example, a reduction lens for focusing the mask pattern onto the object for imaging 42, which may be a semiconductor wafer. The object for imaging 42 is held in position by, for example, a vacuum hold device which is part of and controlled by an accurate X, Y, Z location controller or stepper 44.

Figure 5:
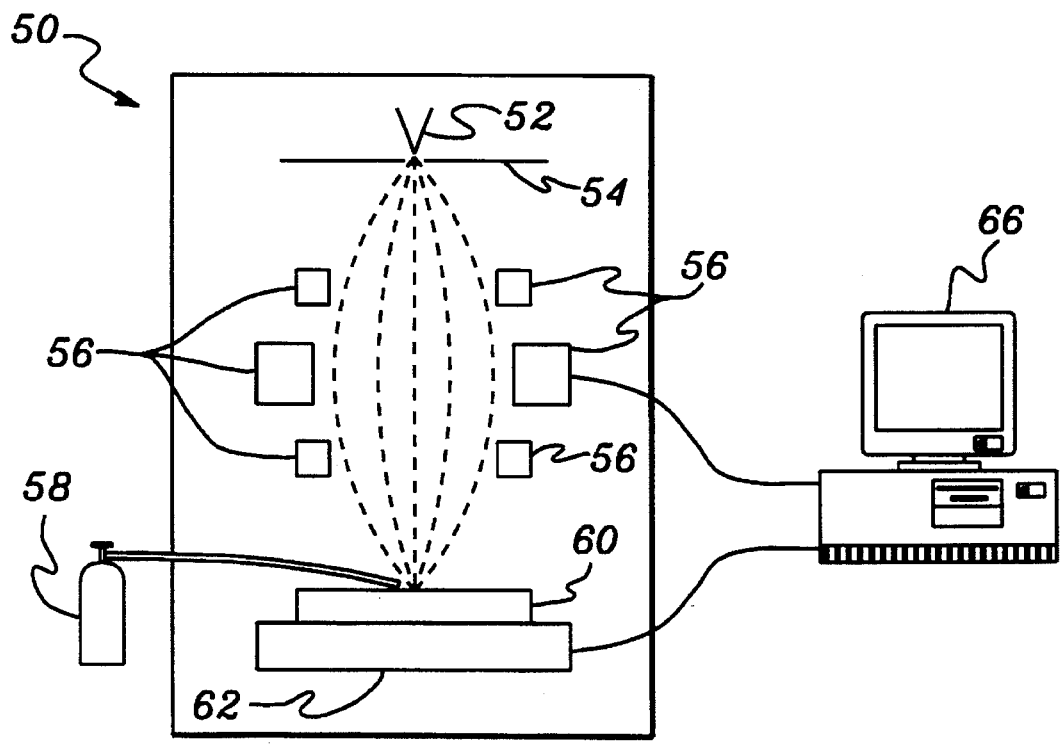
FIG. 5 is a block diagram of a focused ion beam mask repair tool useful in creating the exposure monitor structure of the present invention.

FIG. 5 depicts a focused ion beam mask repair tool 50 useful in creating an exposure monitor on a mask in accordance with the present invention. Mask repair tool 50 comprises a liquid metal ion source 52, an extraction aperture 54, focus and deflection electronics 56, gas source 58 for deposition of opaque patches, mask 60, precision X, Y stage 62, vacuum enclosure 64 and computer controller 66 for controlling stage 62 and focus and deflection electronics 56. The ion beam is controlled in such a way as to decompose the gas at desired regions on the surface of mask 60, which deposits a thin film of carbon or other opaque material. If an opaque region on the mask is desired, this deposition process continues until the desired opacity is produced. By controlling the length of deposition time, any desired level of transmission can be achieved. Because the ion beam is aimed under extremely accurate computer control, any desired two-dimensional pattern can be programmed. Using this equipment, each of the partially transmitting abutting regions can be individually written in the desired part of the mask. It will be understood that focused ion beam mask repair tool 50 is presented herein as merely one example of how to create an exposure monitor of the present invention.

Figure 6:
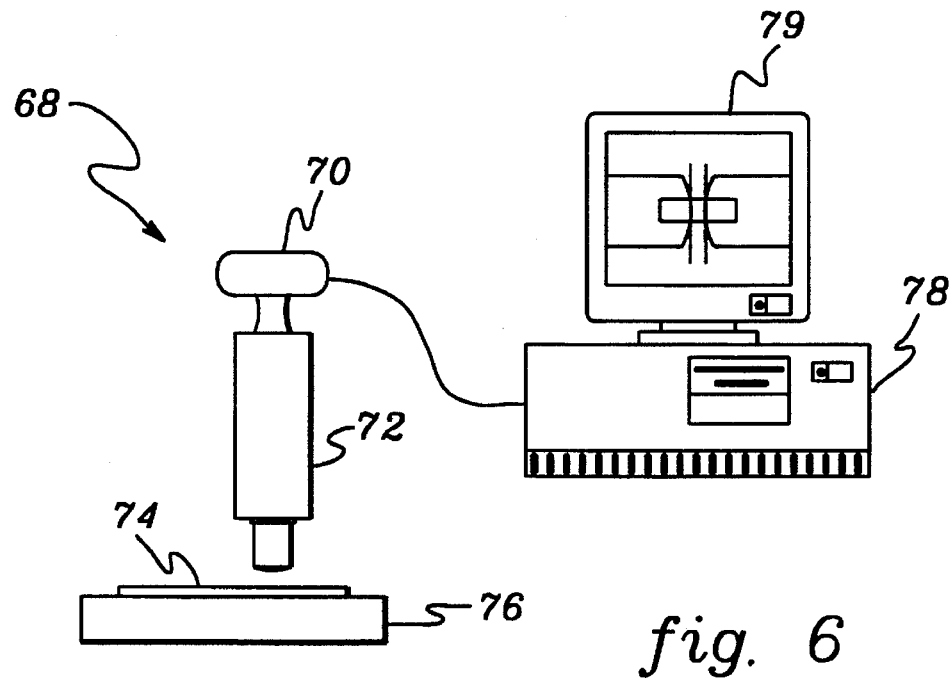
FIG. 6 is a block diagram of an optical measurement tool useful in measuring a gray scale feature imaged by an exposure monitor of the present invention.

FIG. 6 depicts an exemplary optical measurement tool 68 useful in performing the method of the second aspect of the present invention, which will subsequently be described in detail. Optical measurement tool 68 comprises a video camera 70, optical microscope 72, imaged object 74, precision X, Y stage 76 and computer 78 and monitor 79 to capture and display the video image and analyze the dimensions of the image. The imaged object 74 may be, for example, a patterned silicon wafer. The precision X, Y stage 76, which may be controlled by computer 78, moves the imaged object 74 so that optical microscope 72 can capture particular locations thereon.

The optical measurement tool described with respect to FIG. 6 is basically an optical microscope with additional software and metrology instruments, primarily intended to determine line width at a particular designated location by analyzing the optical image. These types of optical measurement tools tend to lose accuracy below about a micron, at which point the use of a more precise measurement tool is generally implemented, such as a scanning electron microscope, which is slower, more expensive and involves cycling the production wafer in through a vacuum.

Figure 7:
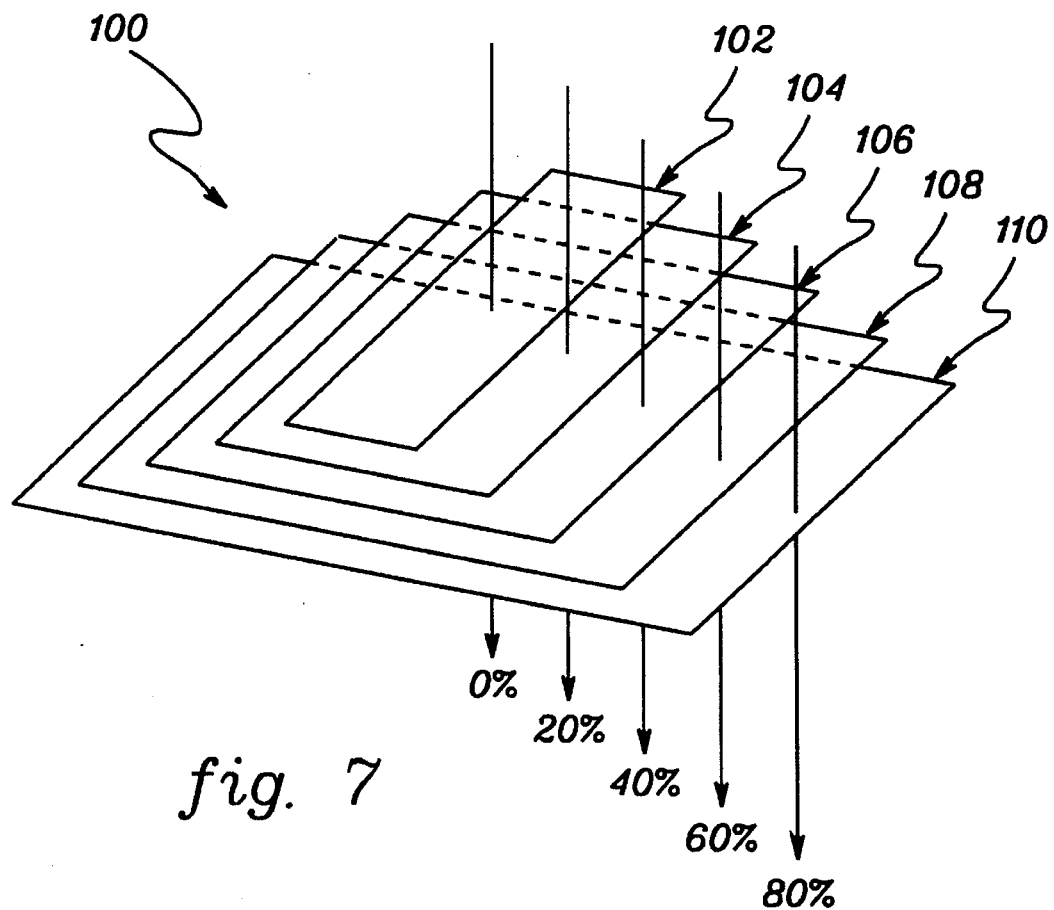
FIG. 7 depicts several layers of different sized carbon patches used to create an exposure monitor of the present invention.

FIG. 7 depicts an exposure monitor 100 according to the present invention and having a preferred structure. Exposure monitor 100 comprises layers 102, 104, 106, 108 and 110, which may be, for example, layers of carbon produced using the focused ion beam mask repair tool 50 of FIG. 5. A given layer is narrower than the one below it, with the superimposed layers creating regions of different light transmissivity. Although the final structure of FIG. 7 is similar to that of FIG. 2, the structure of exposure monitor 100 is preferred, since improper alignment of the separate regions in exposure monitor 18 may lead to clear openings therebetween, whereas the use of layers in exposure monitor 100 lessens the negative effects of misalignment.

Each individual region in the exposure monitor of the present invention should have a width of less than or equal to $(M * 0.5 * \lambda)/NA$, where M is the demagnification of the lithographic lens, $\lambda$ is the exposure wavelength and NA is the numerical aperture of the lithography system that will eventually be used to expose the mask containing the exposure monitor structure. The series of partially transparent or opaque regions are butted against each other, with an optical transmission that decreases or increases either continuously or step-wise in preferably equal increments until a transmission of 0 or 100% is achieved. Although the exposure monitor of the present invention has been described herein as having a mirrored transmission on either side of the center, it could stop at the middle.

An example of determining exposure monitor size will now be given. If the mask containing the exposure monitor of the present invention is used in a stepper with an exposure wavelength of 365 nm and numerical aperture of 0.45, then the printed image of each individual region will be about 0.4 microns or less. If the demagnification of the stepper is five times, this implies that the actual width of each region in the exposure monitor should be about 2 microns or less. The length of each region in the exposure monitor is not critical, but is preferably long enough for convenience in finding and measuring the imaged gray scale feature, for example, 5 to 10 microns long in the imaged gray scale feature, or 25 to 50 microns long in the exposure monitor structure. When the exposure monitor is imaged on a photoresist-coated semiconductor wafer, it will produce a single wide line of photoresist after exposure and development. The width of the line will be a sensitive function of the exposure, resist sensitivity and processing conditions. Measurement of the width of the gray scale feature provides data for accurate control of exposure in succeeding wafers passing through the lithography system, or it could be used as a pass/rework criterion for wafer inspection.

The requirement that the individual regions of the exposure monitor of the present invention have a width less than (M * 0.5 * λ)/NA takes advantage of optical diffraction effects that cause the edges of immediately adjacent regions to blur together. The effects of optical diffraction produce an image of the exposure monitor having a uniform gradient of intensity from the center of the image to the edge. The image printed by the exposure monitor has a desirable linear dependance of line width on exposure. If wider regions were used in the exposure monitor, the intensity variations at the edge of the image would become step-wise discontinuous, which is undesirable. In this case, gradual changes in exposure result in little change in linewidth of the image until a certain exposure threshold is passed, when the linewidth would suddenly change.

An exposure monitor according to the present invention is envisioned to be created on a mask along with a primary image pattern, such as one to be imaged on a semiconductor wafer. It could also be on a mask by itself used, for example, to calibrate the lithographic system. The imaged gray scale feature created by light that has passed through the exposure monitor may be, for example, included on a product wafer or on a sacrificial wafer. If included on a product wafer, some or all of the product wafers could be chosen for measurement of the imaged gray scale feature in order to determine critical feature size on the wafer due to exposure. If the gray scale feature is included on a sacrificial wafer, it may be used for calibration purposes prior to production and/or at various times in the production process for feedback purposes to fine tune the imaging system used.

Figure 8:
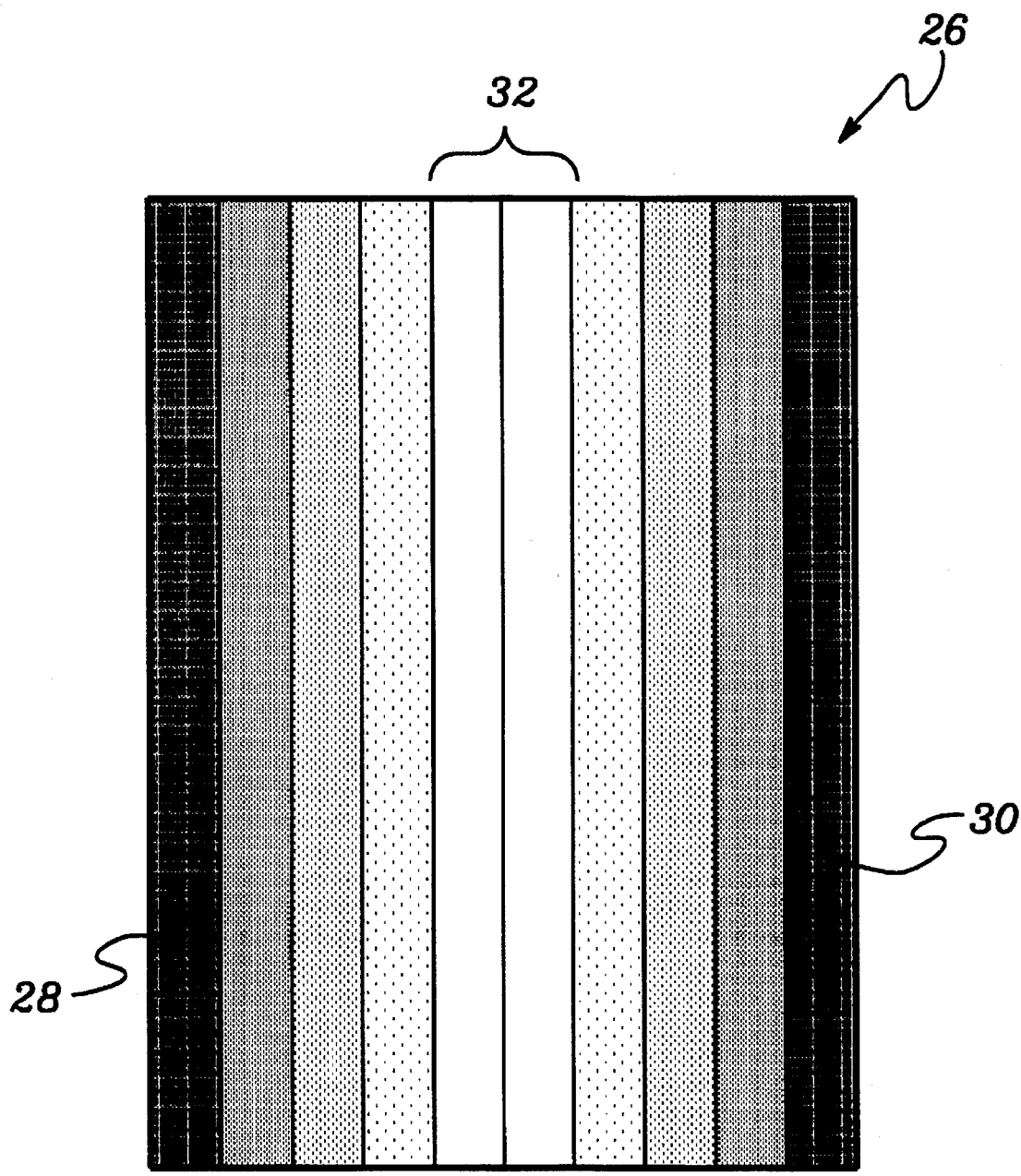
FIG. 8 depicts an exposure monitor according to the present invention having an inverse tone of the exposure monitor of FIG. 2.
Figure 9:
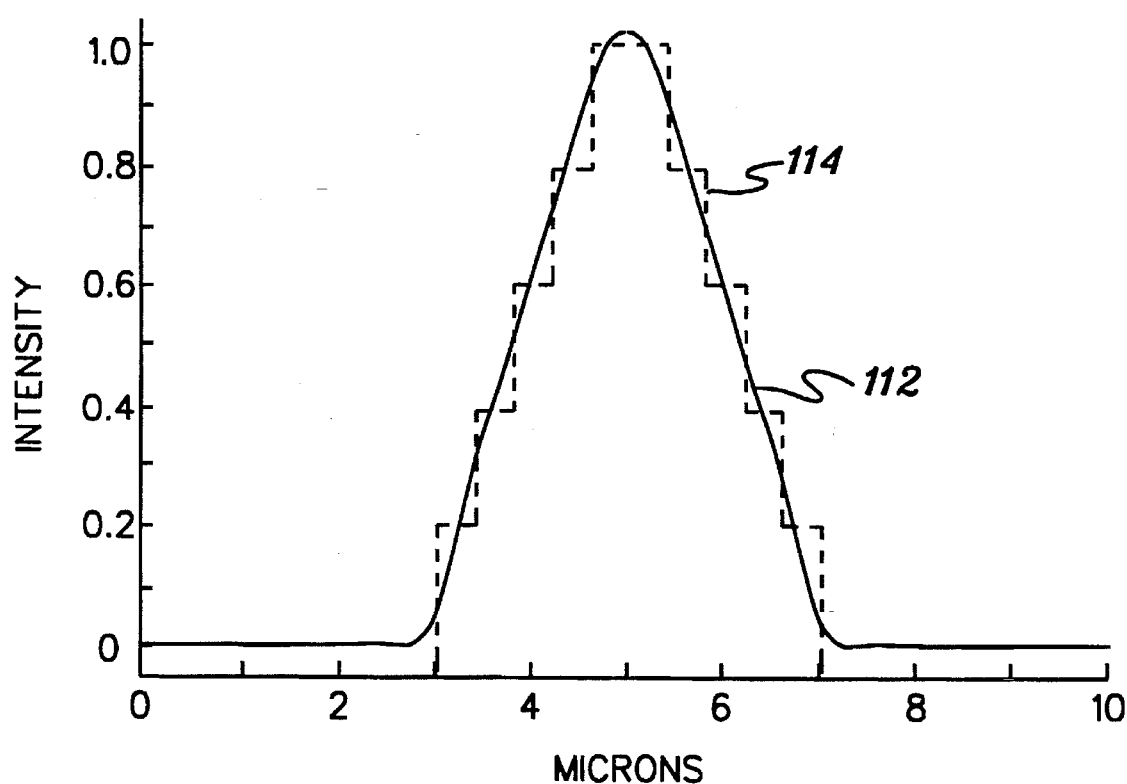
FIG. 9 depicts an aerial image of a gray scale feature imaged by the exposure monitor of FIG. 8.

FIG. 8 depicts an alternate exposure monitor 26 of inverse tone from that of FIG. 2. Exposure monitor 26 fades from end portions 28 and 30 that are nearly opaque to center portion 32 that is clear. FIG. 9 depicts an aerial image 112 of a gray scale feature imaged by the exposure monitor 26 of FIG. 8. Light transmission plot 114 superimposed on aerial image 112 shows the transmission of light across exposure monitor 26.

Figure 10:
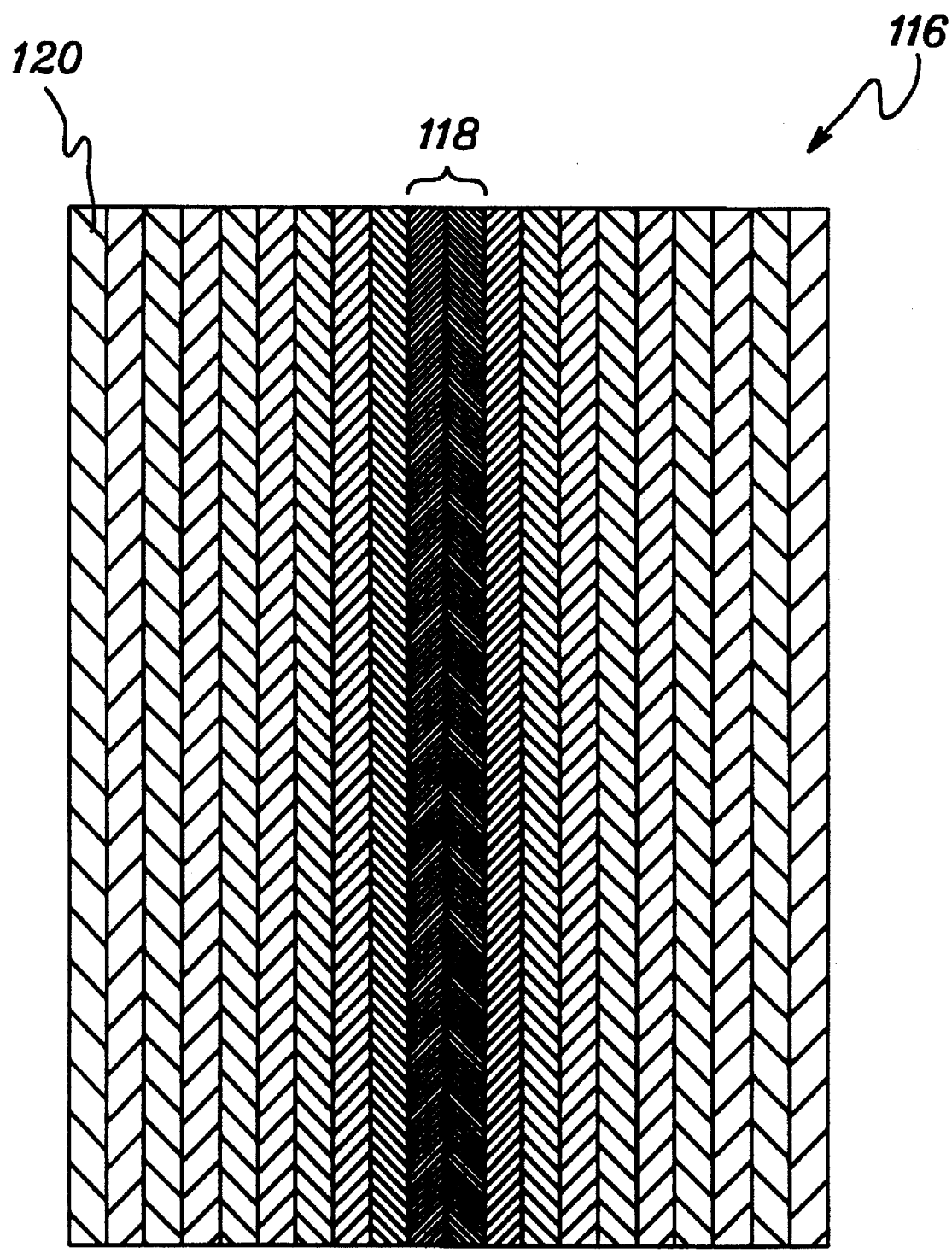
FIG. 10 depicts another exposure monitor according to the present invention similar to that of FIG. 2, but with more light transmission steps.
Figure 11:
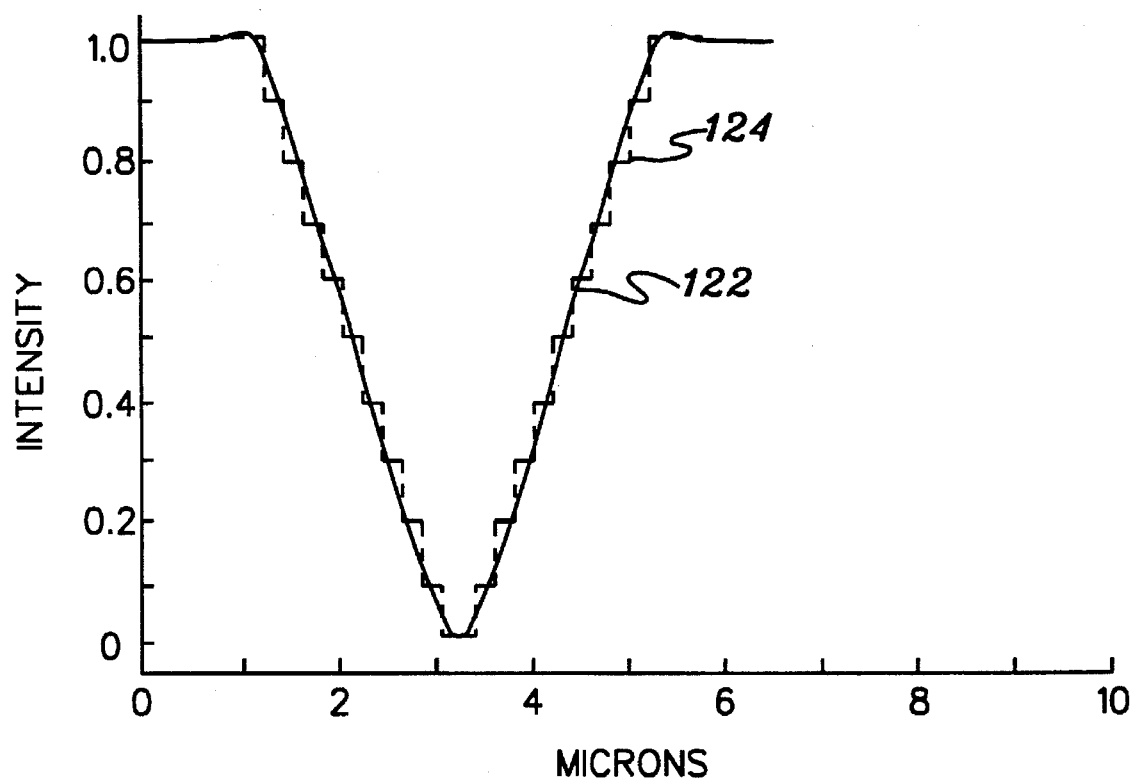
FIG. 11 depicts an aerial image of a gray scale feature imaged by the exposure monitor of FIG. 10.

FIG. 10 depicts another embodiment of an exposure monitor 116 according to the present invention. Exposure monitor 116 is similar to exposure monitor 18 in FIG. 2, except that there are a larger number of steps having a smaller incremental change of light transmission. For example, region 118 corresponds to a region in the exposure monitor where no light is transmitted therethrough, and region 120 corresponds to a region having about 90% transmission. The regions between region 118 and region 120 correspond to regions of the exposure monitor of equal 10% steps in terms of light transmission. FIG. 11 depicts an aerial image 122 corresponding to a gray scale feature imaged by exposure monitor 116 in FIG. 10. Superimposed on aerial image 122 is light transmission plot 124, corresponding to light transmission out of exposure monitor 116.

Figure 12:
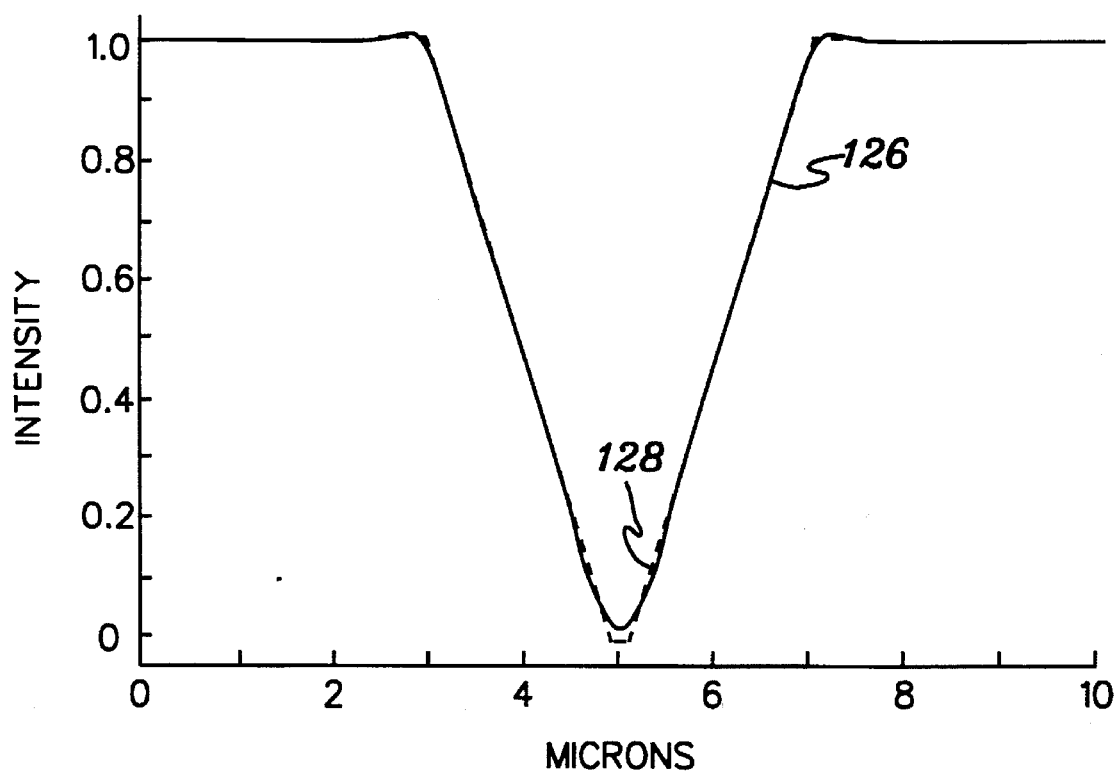
FIG. 12 depicts an aerial image of a gray scale feature similar to that represented by the aerial image of FIG. 11, except that it is created with a continuous, rather than stepwise, exposure monitor.

FIG. 12 depicts a possible aerial image 126 and corresponding superimposed ideal light transmission plot 128 for a gray scale feature similar to that shown in FIG. 11, except that rather than having a step-wise light transmission, it is continuous. If focused ion beam mask repair tool 50 were programmed properly, it may be able to deposit the carbon in a continuous fashion across the structure, rather than depositing discrete regions as described with respect to FIGS. 2 and 7. This might also be achieved by taking the increase in the number of steps as envisioned in FIG. 10 to an extreme where the number of steps is increased to an amount approaching a continuous transition.

The descriptions of the exposure monitor of the present invention so far have focused on having a uniform progression of transmission values from the center to the edge of the gray scale feature. However, it may be desirable in some circumstances to have a non-uniform progression of transmission values, either step-wise as in FIG. 2, or continuously as described with respect to FIG. 12. Such non-uniform progression of light transmission may be accomplished, for example, to improve the linearity of the line width versus exposure response of the gray scale feature, as measured by experiment.

Figure 13:
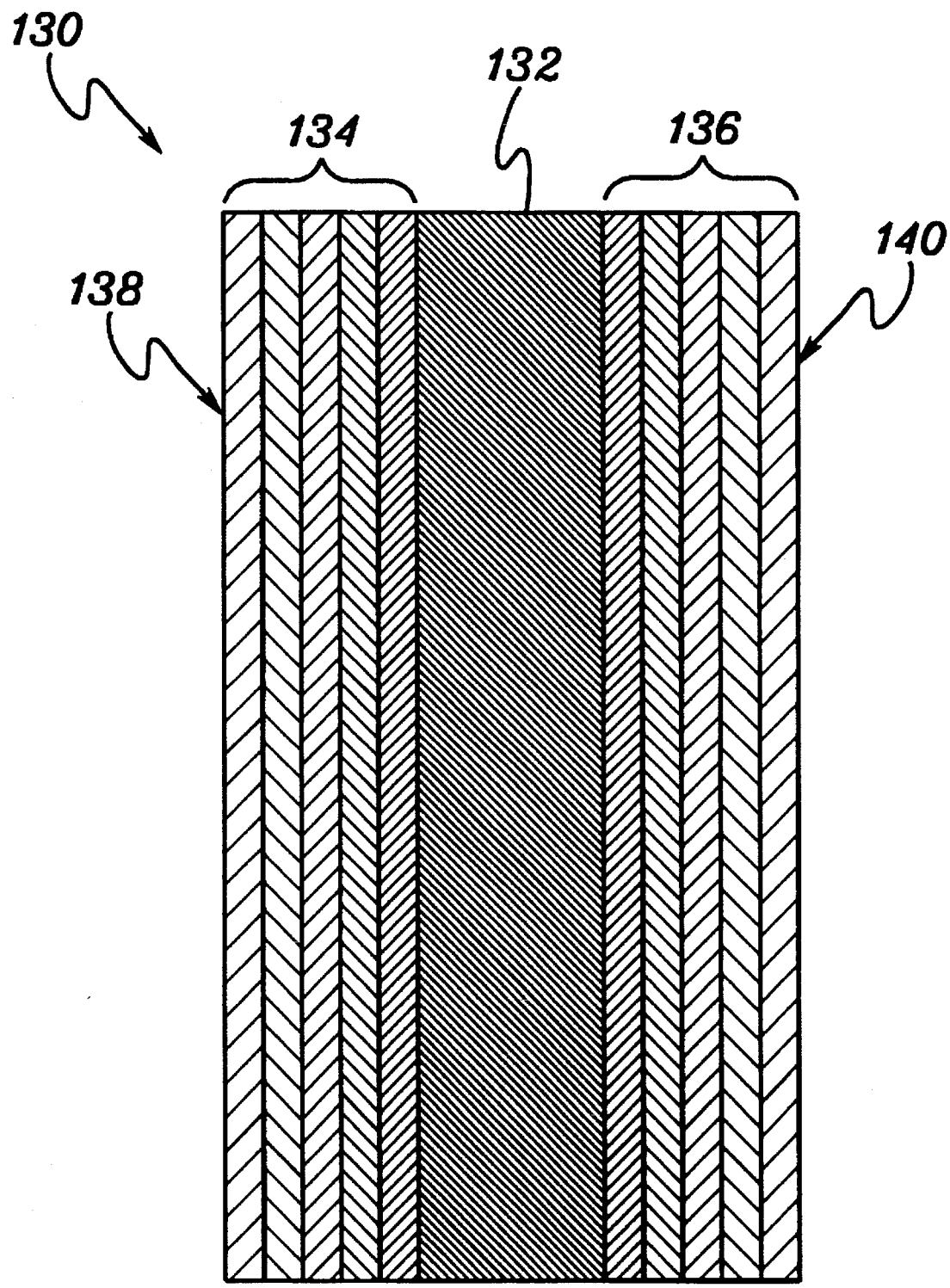
FIG. 13 depicts another exposure monitor according to the present invention having a more narrow range of light transmissions than that of FIG. 2.

FIG. 13 depicts an abbreviated exposure monitor 130 in accordance with the present invention. Exposure monitor 130 comprises a large central opaque region 132 surrounded by identical step-wise transition regions 134 and 136 across a range of transmission values of interest, for example, between 20% and 40% transmission, with an abrupt increase to 100% transmission at the edges 138 and 140. Alternatively, transition regions 134 and 136 could be continuous instead of step-wise. The particular range chosen may be centered within the range of exposures that provide the best control of the actual critical features being imaged. This stems from the fact that convention is to adjust the exposure to print at about 30% of the full intensity, which provides a line width very close to design using modern imaging equipment.

Figure 14:
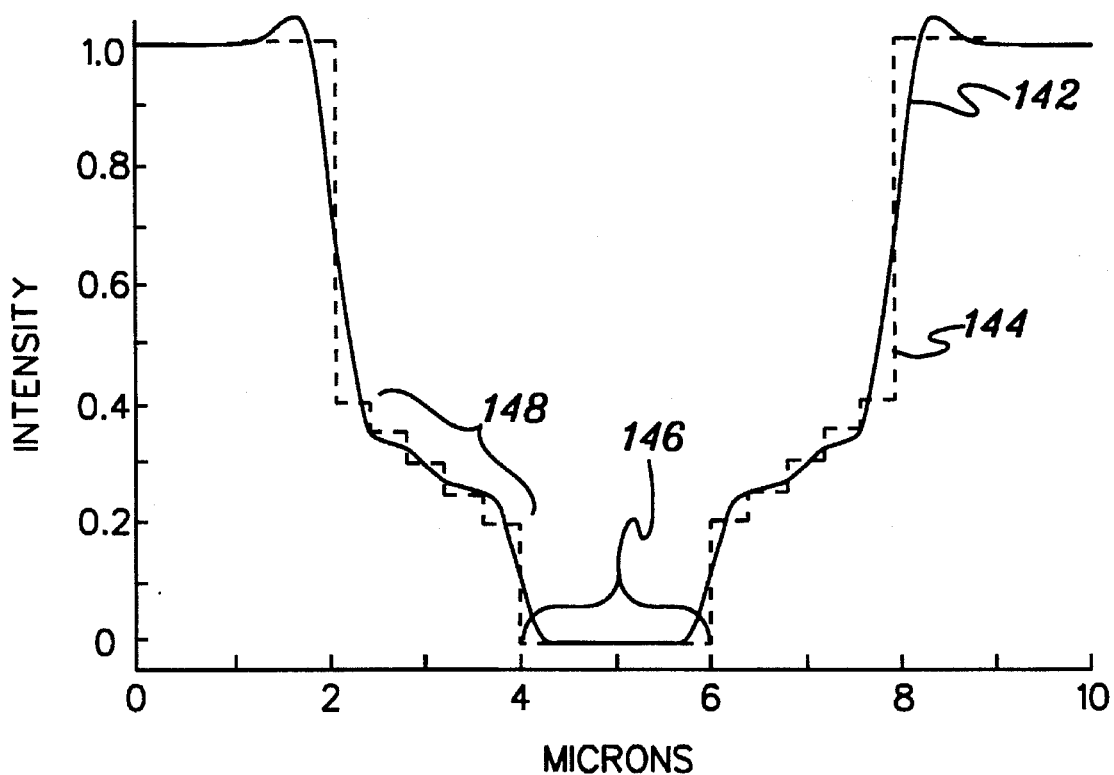
FIG. 14 depicts an aerial image of a gray scale feature imaged by the exposure monitor of FIG. 13.

FIG. 14 depicts aerial image 142 of a gray scale imaged by the abbreviated exposure monitor feature 130 of FIG. 13. Superimposed on aerial image 142 is light transmission plot 144 of the exposure monitor, with region 146 corresponding to the central opaque portion 132 and region 148 corresponding to step-wise transition region 134.

Figure 15:
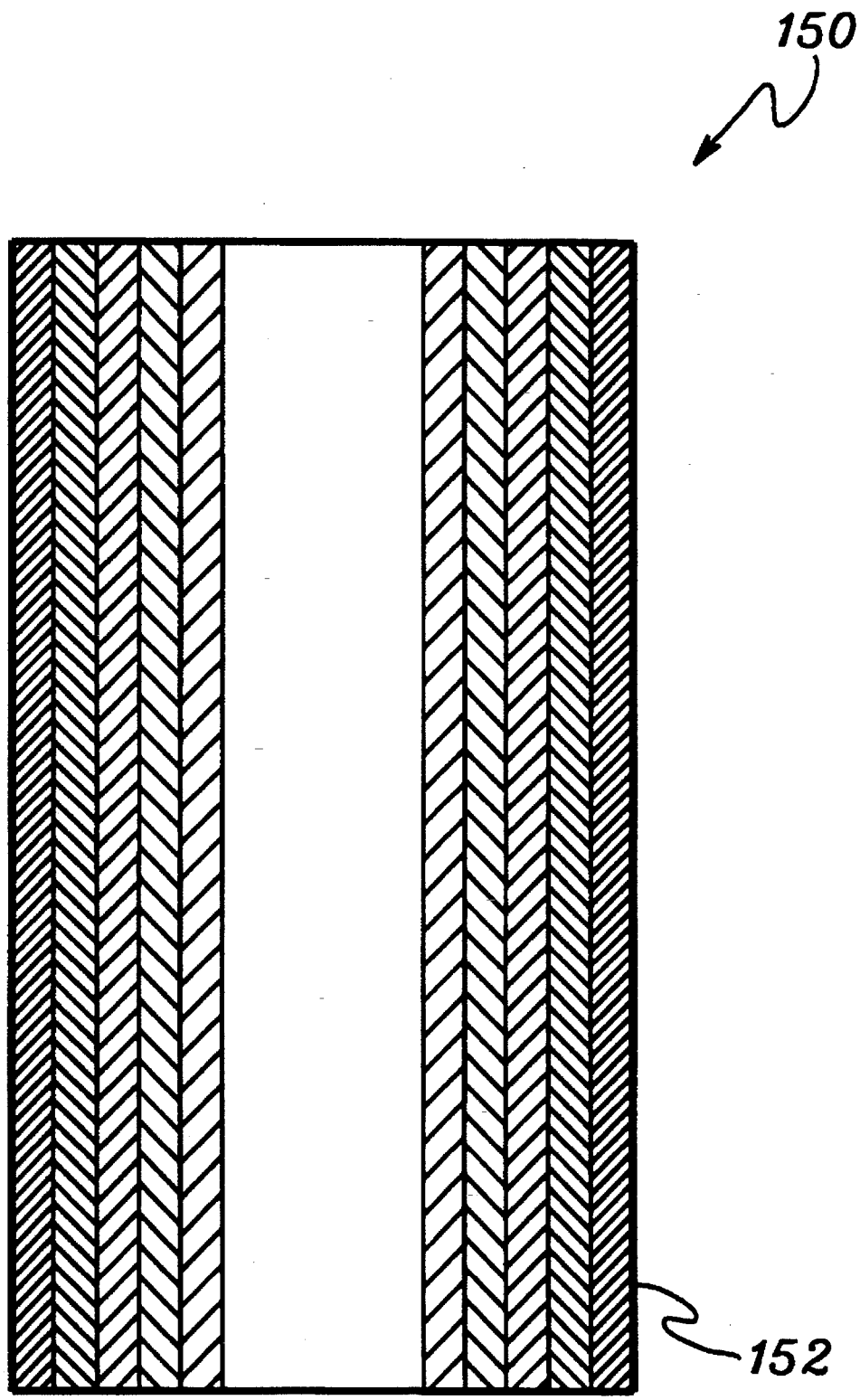
FIG. 15 depicts still another exposure monitor according to the present invention having an inverse tone of the exposure monitor of FIG. 13.
Figure 16:
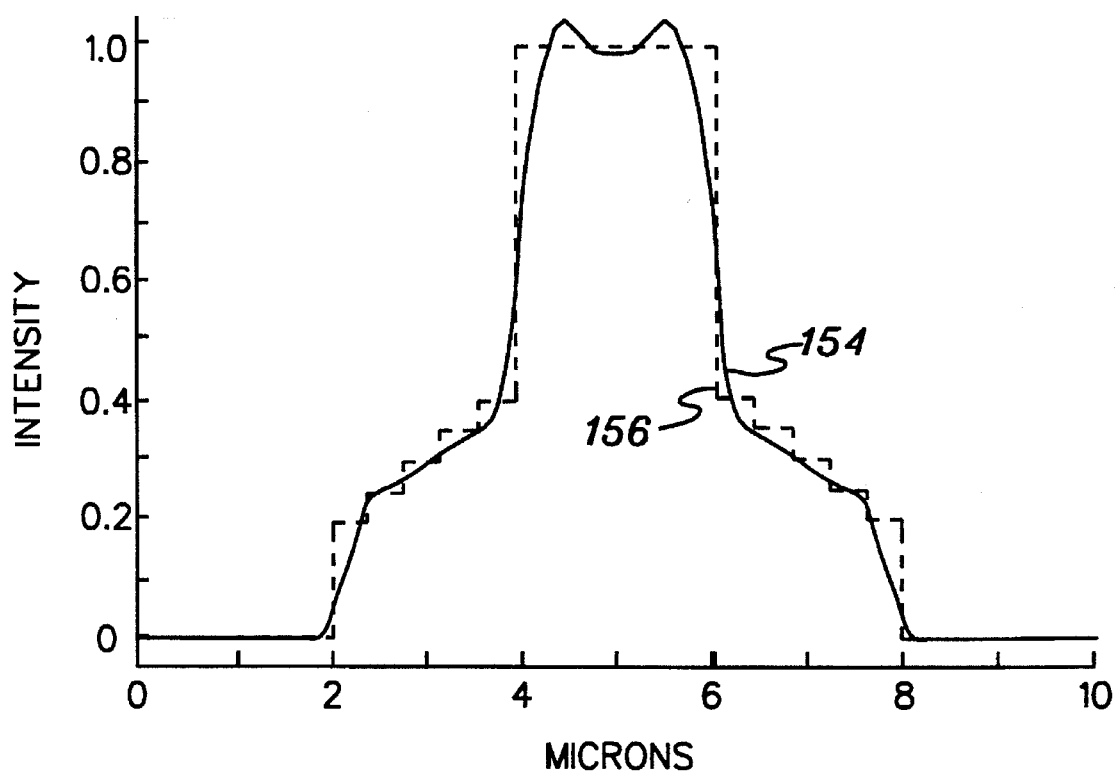
FIG. 16 depicts an aerial image of a gray scale feature imaged by the exposure monitor of FIG. 15.

FIG. 15 depicts an exposure monitor 150, which is the inverse tone of the abbreviated exposure monitor 130 in FIG. 13. Preferably, surrounding exposure monitor 150 is an opaque area 152 corresponding to 0% transmission, which facilitates measurement of the imaged gray scale feature. FIG. 16 depicts an aerial image 154 of a gray scale feature imaged by the exposure monitor 150 of FIG. 15. Superimposed on aerial image 154 is light transmission plot 156 showing the light transmission out of exposure monitor 150.

In a second aspect of the present invention, a method for monitoring exposure in a lithographic system is presented. In general, once a gray scale feature according to the present invention is imaged (including developing), the imaged gray scale feature is measured as if it were one line, preferably using an optical measurement tool. Based on a calibration procedure to be described in detail subsequently, the measurement of the gray scale feature is indicative of critical feature size, as well as exposure. As used herein, the term "critical feature" refers to the smallest feature size to be imaged. The calibration procedure calibrates the width of a gray scale feature against actual exposure requirements as evidenced by the size of critical features being produced. The calibration procedure may be accomplished with a mask including a critical feature to be imaged and an exposure monitor according to the present invention. A series of images may then be created over a range of exposure on a calibration wafer. After imaging, the wafer is developed and measurements are made of the various gray scale features over the exposure range using an optical measurement tool, such as the one depicted in FIG. 6, in order to correlate gray scale feature size to exposure. As exposure increases, one would expect that the gray scale feature size would decrease. The critical feature imaged would then be measured to correlate critical feature size to exposure. Critical feature size may be such that a more powerful measurement tool than an optical measurement tool may be required, such as a scanning electron microscope. The sets of size to exposure data obtained are then cross-correlated, and may be placed into a form of a calibration curve graph where line width of the exposure monitor is plotted against line width of the critical features to determine control limits for critical features as related to the gray scale features.

Figure 17:
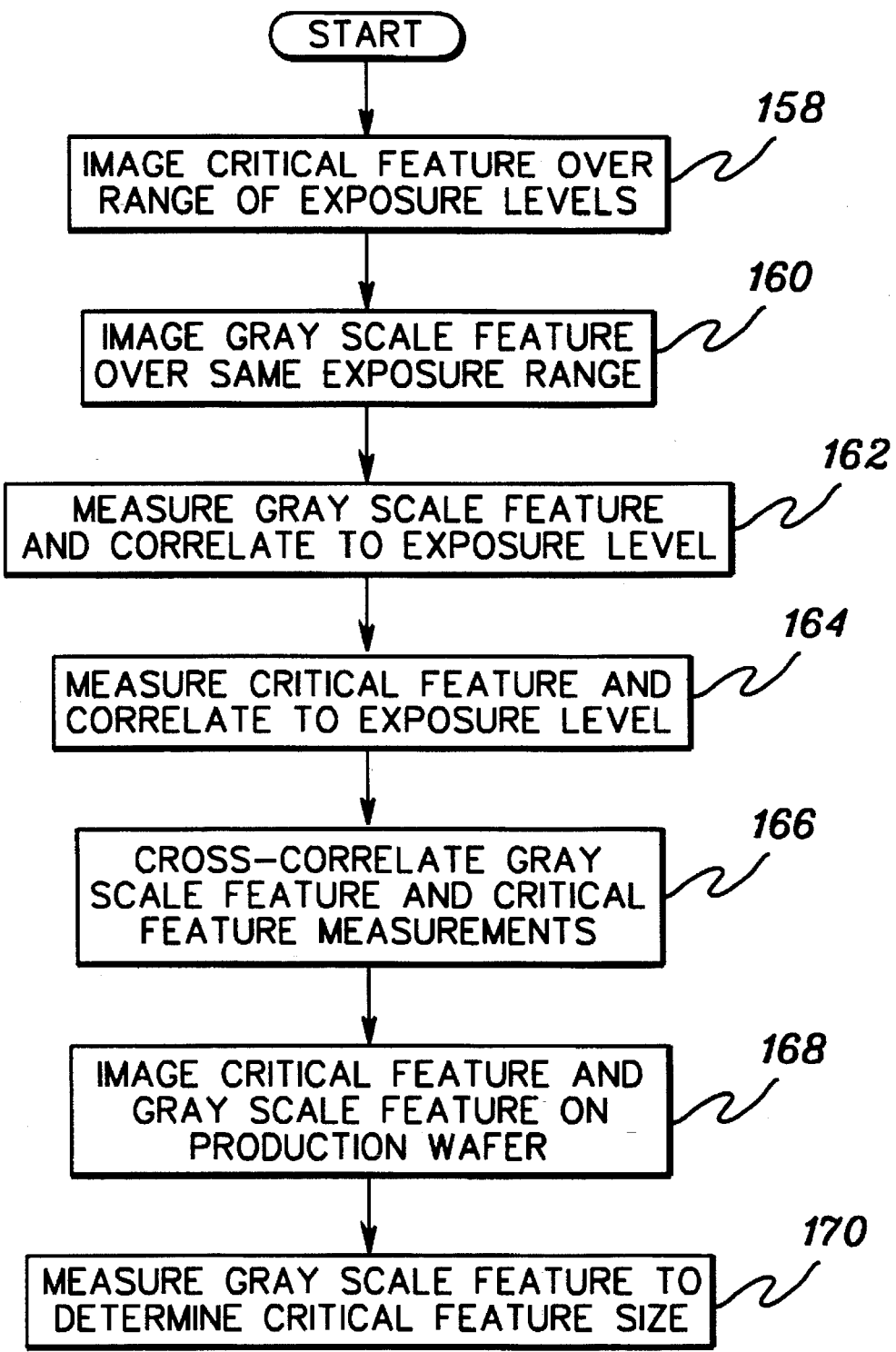
FIG. 17 depicts a flow diagram of a method for monitoring exposure in a lithographic system according to the present invention.

FIG. 17 is a flow diagram of the method of the second aspect of the present invention. The method begins by calibrating gray scale feature size to critical feature size, imaging a critical feature and a gray scale feature in resist, and measuring the gray scale feature to determine critical feature size. More specifically, the method begins by imaging one or more critical features over a range of exposure levels (STEP 158, "IMAGE CRITICAL FEATURE OVER RANGE OF EXPOSURE LEVELS"). Gray scale features are also imaged in the same lithography system over the same exposure range (STEP 160, "IMAGE Gray scale feature OVER SAME EXPOSURE RANGE"). The imaged gray scale features and critical features are then measured and correlated to the exposure levels (STEP 162, "MEASURE Gray scale featureS AND CORRELATE TO EXPOSURE LEVEL"; STEP 164, "MEASURE CRITICAL FEATURE AND CORRELATE TO EXPOSURE LEVEL"). After correlating to exposure level, the data obtained for the gray scale features and critical features is cross-correlated to relate gray scale feature size to critical feature size (STEP 166, "CROSS-CORRELATE Gray scale feature AND CRITICAL FEATURE MEASUREMENTS"). After cross-correlating, a critical feature and gray scale feature are imaged in a light-sensitive material, for example, resist, preferably on a production wafer (STEP 168, "IMAGE CRITICAL FEATURE AND Gray scale feature ON PRODUCTION WAFER"). The imaged gray scale feature may then be measured, preferably using an optical measurement tool, to determine critical feature size (STEP 170, "MEASURE Gray scale feature TO DETERMINE CRITICAL FEATURE SIZE"). In this way, the size of critical features can be controlled without resorting to slow and expensive measurement tools. In addition, an optical measurement tool is often already used for overlay measurements in lithography, and may be used at the same time to measure the gray scale feature of the present invention, providing further efficiencies in the lithography process.

Preferably, the exposure monitor of the present invention is used in conjunction with a focus monitor, for example, that described in U.S. Pat. No. 5,300,786 issued to Brunner et al. and assigned to IBM, entitled "Optical Focus Phase Shift Pattern, Monitoring System and Process". The cited U.S. patent discloses a focus monitor that can be imaged simultaneous with the exposure monitor of the present invention. In this way, imaging can be controlled by controlling both focus effects and exposure effects.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

We claim:

1. An exposure monitor for imaging a gray scale feature, said exposure monitor comprising a plurality of abutting regions, each of said plurality of abutting regions having an optical density different from that of each other of said plurality of abutting regions immediately adjacent thereto, wherein diffractive blurring through said plurality of abutting regions provides a continuous light distribution in said gray scale feature.

2. The exposure monitor of claim 1, wherein said exposure monitor comprises a substrate and a plurality of patches of different sizes and optical transmissivities layered on said substrate to create said plurality of abutting regions.

3. The exposure monitor of claim 2 wherein said plurality of patches comprises a carbon patch.

4. The exposure monitor of claim 1, wherein said exposure monitor comprises a substrate and wherein said plurality of abutting regions comprises:
   a first patch of film on said substrate having a first optical density; and
   a second patch of film on said substrate abutting said first patch and having a second optical density different than said first optical density.

5. The exposure monitor of claim 4 wherein said first patch and said second patch each comprise a carbon patch.

6. The exposure monitor of claim 1, wherein imaging of each of said plurality of abutting regions is exposure sensitive and focus insensitive.

7. A semiconductor wafer comprising an imaged gray scale feature for monitoring exposure within a lithographic system, wherein said imaged gray scale feature was imaged with an exposure monitor comprising a plurality of abutting regions, each of said plurality of abutting regions having an optical density different from that of each other of said plurality of abutting regions immediately adjacent thereto, wherein diffractive blurring through said plurality of abutting regions provides a continuous light distribution in said gray scale feature.

8. The semiconductor wafer of claim 7 further comprising an imaged critical feature, wherein size of said imaged gray scale feature is indicative of size of said imaged critical feature due to said exposure.

9. A method for monitoring exposure in a lithographic system, said method comprising steps of:
   calibrating exposure in said lithographic system such that size of an imaged gray scale feature is indicative of size of an imaged critical feature;
   imaging a critical feature and a gray scale feature in a layer of light-sensitive material coated on a substrate, wherein said gray scale feature is imaged with an exposure monitor comprising a plurality of abutting regions, each of said plurality of abutting regions having an optical density different from that of each other of said plurality of abutting regions immediately adjacent thereto, wherein diffractive blurring through said plurality of abutting regions provides a continuous light distribution in said gray scale feature; and
   measuring said imaged gray scale feature.

10. The method of claim 9, wherein said step of calibrating comprises steps of:
   imaging in a layer of light-sensitive material coated on a substrate a critical feature at a plurality of exposure levels;
   imaging in said layer of light-sensitive material a gray scale feature at said plurality of exposure levels wherein said gray scale feature is imaged with an exposure monitor comprising a plurality of abutting regions, each of said plurality of abutting regions having an optical density different from that of each other of said plurality of abutting regions immediately adjacent thereto;
   measuring each said imaged gray scale feature and correlating gray scale feature size to exposure level to obtain gray scale exposure data;
   measuring each said imaged critical feature and correlating critical feature size to exposure level to obtain critical feature exposure data; and
   cross-correlating said gray scale exposure data and said critical feature exposure data.

11. The method of claim 9 wherein said step of measuring comprises optically measuring.

* * * * *